United States Patent
Lupas

(10) Patent No.: US 11,928,391 B2
(45) Date of Patent: Mar. 12, 2024

(54) HYBRID SURFACE MODELLING WITH SUBDIVISION SURFACES AND NURBS SURFACES

(71) Applicant: Autodesk, Inc., San Francisco, CA (US)

(72) Inventor: Dan Mircea Lupas, Mississauga (CA)

(73) Assignee: Autodesk, Inc., San Francisco, CA (US)

( * ) Notice: Subject to any disclaimer, the term of this patent is extended or adjusted under 35 U.S.C. 154(b) by 814 days.

(21) Appl. No.: 16/837,618

(22) Filed: Apr. 1, 2020

(65) Prior Publication Data
US 2020/0320228 A1 Oct. 8, 2020

Related U.S. Application Data

(60) Provisional application No. 62/828,186, filed on Apr. 2, 2019.

(51) Int. Cl.
*G06F 30/12* (2020.01)
*B29C 64/386* (2017.01)
(Continued)

(52) U.S. Cl.
CPC ............ *G06F 30/12* (2020.01); *B29C 64/386* (2017.08); *B33Y 50/00* (2014.12); *G06T 17/30* (2013.01); *G06T 11/203* (2013.01)

(58) Field of Classification Search
None
See application file for complete search history.

(56) References Cited

U.S. PATENT DOCUMENTS 5,317,682 A * 5/1994 Luken, Jr. ............... G06F 17/17
345/442
5,377,320 A * 12/1994 Abi-Ezzi ................ G06T 17/20
345/419

(Continued)

OTHER PUBLICATIONS

Kerstin Müller, Lars Reusche, and Dieter Fellner. 2006. Extended subdivision surfaces: Building a bridge between NURBS and Catmull-Clark surfaces. ACM Trans. Graph. 25, 2 (Apr. 2006), 268-292. https://doi.org/10.1145/1138450.113845 (Year: 2006).*

(Continued)

*Primary Examiner* — Akash Saxena
(74) *Attorney, Agent, or Firm* — Fish & Richardson P.C.

(57) ABSTRACT

Methods, systems, and apparatus, including medium-encoded computer program products, for computer aided design of structures include, in one aspect, a method for hybrid surface modelling with subdivision surfaces and NURBS surfaces, the method including: modifying a control mesh (in accordance with received input) of a subdivision surface model including a topological control that tracks mesh to NURBS relationships for a limit surface of the subdivision surface, and stored NURBS surfaces representing the limit surface; obtaining an updated limit surface from the modified control mesh; finding at least one modified NURBS surface in the stored NURBS surfaces in accordance with relationship(s) tracked in the topological control; and for each modified NURBS surface, updating the modified NURBS surface with its corresponding replacement NURBS surface, and applying at least one geometric modification (associated with a modified NURBS surface in a history procedures system) to the associated modified NURBS surface after its update.

23 Claims, 9 Drawing Sheets

(51) Int. Cl.
  *B33Y 50/00* (2015.01)
  *G06T 11/20* (2006.01)
  *G06T 17/30* (2006.01)

(56) References Cited

U.S. PATENT DOCUMENTS

| | | | | |
|---|---|---|---|---|
| 5,701,404 | A * | 12/1997 | Stevens | G06T 17/30 |
| | | | | 345/442 |
| 6,683,620 | B1 * | 1/2004 | Burke | G06T 17/30 |
| | | | | 345/623 |
| 7,174,280 | B2 * | 2/2007 | Stewart | G06T 17/30 |
| | | | | 703/2 |
| 7,200,532 | B1 * | 4/2007 | Cheng | G06T 17/20 |
| | | | | 703/2 |
| 7,212,205 | B2 * | 5/2007 | Uesaki | G06T 17/30 |
| | | | | 345/442 |
| 7,236,170 | B2 * | 6/2007 | Sepulveda | G06T 19/20 |
| | | | | 345/646 |
| 7,400,323 | B2 * | 7/2008 | Nigro | G06T 17/30 |
| | | | | 345/420 |
| 7,595,799 | B2 * | 9/2009 | Nigro | G06T 17/20 |
| | | | | 345/420 |
| 7,643,026 | B2 * | 1/2010 | Chai | G06T 17/30 |
| | | | | 345/442 |
| 7,643,030 | B2 * | 1/2010 | Papakipos | G06T 17/30 |
| | | | | 345/441 |
| 8,284,193 | B2 * | 10/2012 | Hanisch | G06T 17/30 |
| | | | | 345/442 |
| 8,878,845 | B2 * | 11/2014 | Brown | G06T 19/20 |
| | | | | 345/650 |
| 9,196,090 | B2 * | 11/2015 | Maisonneuve | G06F 30/00 |
| 10,108,752 | B2 * | 10/2018 | Maisonneuve | G06T 19/20 |
| 10,255,381 | B2 * | 4/2019 | Walle | G06F 17/10 |
| 10,467,807 | B1 * | 11/2019 | Strater | G06T 17/30 |
| 10,896,541 | B2 * | 1/2021 | Strater | G06F 30/23 |
| 11,120,625 | B2 * | 9/2021 | Pförtner | G06T 17/20 |
| 11,144,679 | B2 * | 10/2021 | Maisonneuve | G06T 17/20 |
| 2003/0197701 | A1 * | 10/2003 | Teodosiadis | G06T 17/30 |
| | | | | 345/420 |
| 2003/0200066 | A1 * | 10/2003 | Stewart | G06T 17/30 |
| | | | | 703/2 |
| 2005/0248562 | A1 * | 11/2005 | Maystrovsky | G06F 30/00 |
| | | | | 345/419 |
| 2007/0030268 | A1 * | 2/2007 | Nigro | G06T 17/30 |
| | | | | 345/423 |
| 2008/0225043 | A1 * | 9/2008 | Rosel | G06T 17/30 |
| | | | | 345/420 |
| 2012/0154399 | A1 * | 6/2012 | Munkberg | G06T 17/20 |
| | | | | 345/423 |
| 2012/0191423 | A1 * | 7/2012 | Dokken | G06T 17/30 |
| | | | | 703/1 |
| 2014/0081400 | A1 * | 3/2014 | Azernikov | G06T 19/20 |
| | | | | 703/1 |
| 2016/0224693 | A1 * | 8/2016 | Maisonneuve | G06F 30/00 |
| 2018/0104912 | A1 * | 4/2018 | Bastian | B29C 64/112 |
| 2018/0293791 | A1 * | 10/2018 | Sederberg | G06T 17/30 |
| 2020/0151953 | A1 * | 5/2020 | Strater | G06F 30/10 |
| 2020/0207024 | A1 * | 7/2020 | Morris | G06T 17/30 |
| 2020/0320228 | A1 * | 10/2020 | Lupas | G06T 17/30 |
| 2020/0320785 | A1 * | 10/2020 | Pförtner | G06T 17/205 |
| 2021/0294300 | A1 * | 9/2021 | Grau | G06F 30/20 |
| 2022/0309749 | A1 * | 9/2022 | Marshall | G06T 17/30 |

OTHER PUBLICATIONS

Thomas J. Cashman, Ursula H. Augsdörfer, Neil A. Dodgson, and Malcolm A. Sabin. 2009. NURBS with extraordinary points: high-degree, non-uniform, rational subdivision schemes. ACM Trans. Graph. 28, 3, Article 46 (Aug. 2009), 9 pages. https://doi.org/10.1145/1531326.1531352 (Year: 2009).*

Pförtner et al., U.S. Appl. No. 62/828,127, "Producing Overall Curvature Continuous Surfaces from Subdivision Surface Meshes," filed Apr. 2, 2019, 33 pages.

Ismail, "Introduction into NURBS," (Aug. 1, 2015) [online] (retrieved from https://www.ebalstudios.com/blog/introduction-nurbs), 26 pages.

Schäfer et al., "Dynamic Feature-adaptive Subdivision," In Proceedings of the 19th Symposium on Interactive 3D Graphics and Games (i3D '15). ACM, New York, NY, USA, 31-38. https://doi.org/10.1145/2699276.2699282.

Unknown author, Subdivision Surface Modeling, Autodesk® Maya® 2011 Software, © 2010 Autodesk, Inc., 68 pages.

Unknown author, "DEVELOP3D—Review: Autodesk Alias 2020," (Jan. 8, 2020) [online] (retrieved from https://develop3d.com/reviews/review-autodesk-alias-2020-automotive-industrial-desi), 6 pages.

Unknown author, "Non-uniform Rational B-spline—Wikipedia," (Mar. 21, 2019) [online] (retrieved from https://en.wikipedia.org/wiki/Non-uniform_rational_B-spline), 12 pages.

Unknown author, "Power SubD-NURBS for 3ds Max®," (Mar. 25, 2019) [online] (retrieved from https://www.ebalstudios.com/blog/introduction-nurbs), 3 pages.

Unknown author, "Subdivision surface—Wikipedia," (Mar. 21, 2019) [online] (retrieved from https://en.wikipedia.org/wiki/Subdivision_surface), 5 pages.

Unknown author, "Subdivision Surfaces," (Mar. 27, 2019) [online] (retrieved from http://graphics.pixar.com/opensubdiv/docs/subdivision_surfaces.html), 5 pages.

Unknown author, "T-spline—Wikipedia," (Mar. 21, 2019) [online] (retrieved from https://en.wikipedia.org/wiki/T-spline), 2 pages.

Yong et al., "Adaptive Subdivision of Catmull-Clark Subdivision Surfaces," Computer-Aided Design & Application, 2005, 2(1-4):253-261.

Cashman et al., "NURBS with extraordinary points: high-degree, non-uniform, rational subdivision schemes", ACM SIGGRAPH, 2009, 10 pages.

* cited by examiner

HYBRID SURFACE MODELLING WITH SUBDIVISION SURFACES AND NURBS SURFACES

CROSS-REFERENCE TO RELATED APPLICATIONS

This application claims the benefit under 35 U.S.C. § 119(e) of U.S. Patent Application No. 62/828,186, entitled "HYBRID SURFACE MODELLING WITH SUBDIVISION SURFACES AND NURBS SURFACES", filed Apr. 2, 2019, which is hereby incorporated by reference.

BACKGROUND

This specification relates to surface modelling in computer graphics applications, such as computer generated animation and computer aided design of physical structures to be manufactured using additive manufacturing, subtractive manufacturing and/or other manufacturing systems and techniques.

In three dimensional (3D) computer graphics applications, a Subdivision Surface is a geometric representation of a smooth surface in which the smooth surface is defined by a piecewise linear polygon mesh. The smooth surface is calculated from the polygon mesh using a predefined refinement scheme that determines the limit of recursive subdivision of each polygon face into smaller faces that better approximate the smooth surface. In some Subdivision Surface applications, the limit surface is calculated directly using known techniques, rather than through recursive procedure calls. Subdivision Surfaces are often used for the creation and final rendering of character shapes in computer animation. For example, PIXAR® provides open source Subdivision Surface code called OpenSubdiv for Subdivision Surface computation.

Non-Uniform Rational Basis Spline (NURBS) is another smooth surface modelling representation used in 3D computer graphics applications. A NURBS surface is a geometric representation of a smooth surface where the NURBS surface is described by its degree, weighted control vertices and knot vector. NURBS surfaces are a generalization of Bézier surfaces, are commonly used in Computer Aided Design (CAD) and Computer Aided Industrial Design (CAD) programs as the primary representation of surfaces, and are part of various industry wide standards. In addition, NURBS surfaces can be the limit surfaces output from a Subdivision Surface computation, with the restriction that these NURBS surfaces are not an exact representation of the limit surface in extraordinary regions.

SUMMARY

This specification relates to surface modelling in computer graphics applications, such as computer generated animation and computer aided design of physical structures to be manufactured using additive manufacturing, subtractive manufacturing and/or other manufacturing systems and techniques, in which hybrid surface modelling is effected with subdivision surfaces and NURBS surfaces. Particular embodiments of the subject matter described in this specification can be implemented to realize one or more of the following advantages. Hybrid surface modelling with Subdivision Surface and NURBS, as described herein, enables the integration of these two technologies to provide seamless hybrid modeling using both types of geometrical entities, which can remove the respective limitations of subdivision surface and NURBS surfaces, and combine their strengths, for defining a new 3D modeling paradigm. Subdivision Surface and NURBS methods need not be isolated from each other for geometric modeling in CAD/CAID applications. Complex shapes can be readily created by a user without the user needing to define quad patches to lay out the geometry and then use techniques like trimming to modify those quad patches, which often results in slow and tedious workflows in shape modelling design, especially for less experienced users.

With the described hybrid surface modelling approach, a Subdivision Surface model can be used to define a complex shape quickly by a user, and NURBS surface(s) are generated for the limit surface, which can provide a higher quality surface definition than can be achieved using just a Subdivision Surface. The user can also modify the NURBS surface(s) using the control vertices therefor. Moreover, the NURBS surfaces resulting from the subdivision surface can be exposed to the data model of the application as native NURBS entities so the NURBS surface modeling tools can operate on them directly without having input indicating that the NURBS surfaces are associated with a subdivision surface. This combination of surface modelling attributes from Subdivision Surface and NURBS technologies can have significant impacts on reducing the design cycle, by speeding up the form-finding and concept design workflows using Subdivision Surfaces modelling workflows, combined with the ability to complete the design by adding high quality (Class-A) surfacing details, like fillets, panel gaps, trims etc., using NURBS modeling tools, all in one unified model, which can be evaluated using advanced NURBS evaluation tools and can be further passed down the design pipeline all the way to engineering, or directly sent to manufacturing for creating high fidelity prototypes. Also, the hybrid modeling can speed up significantly the iterative reverse engineering process, which is the process of converting scan data into NURBS data, by using fast Subdivision Surfaces workflows, replacing the surface patch layout workflows using NURBS surfacing tools, which is significantly slower.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
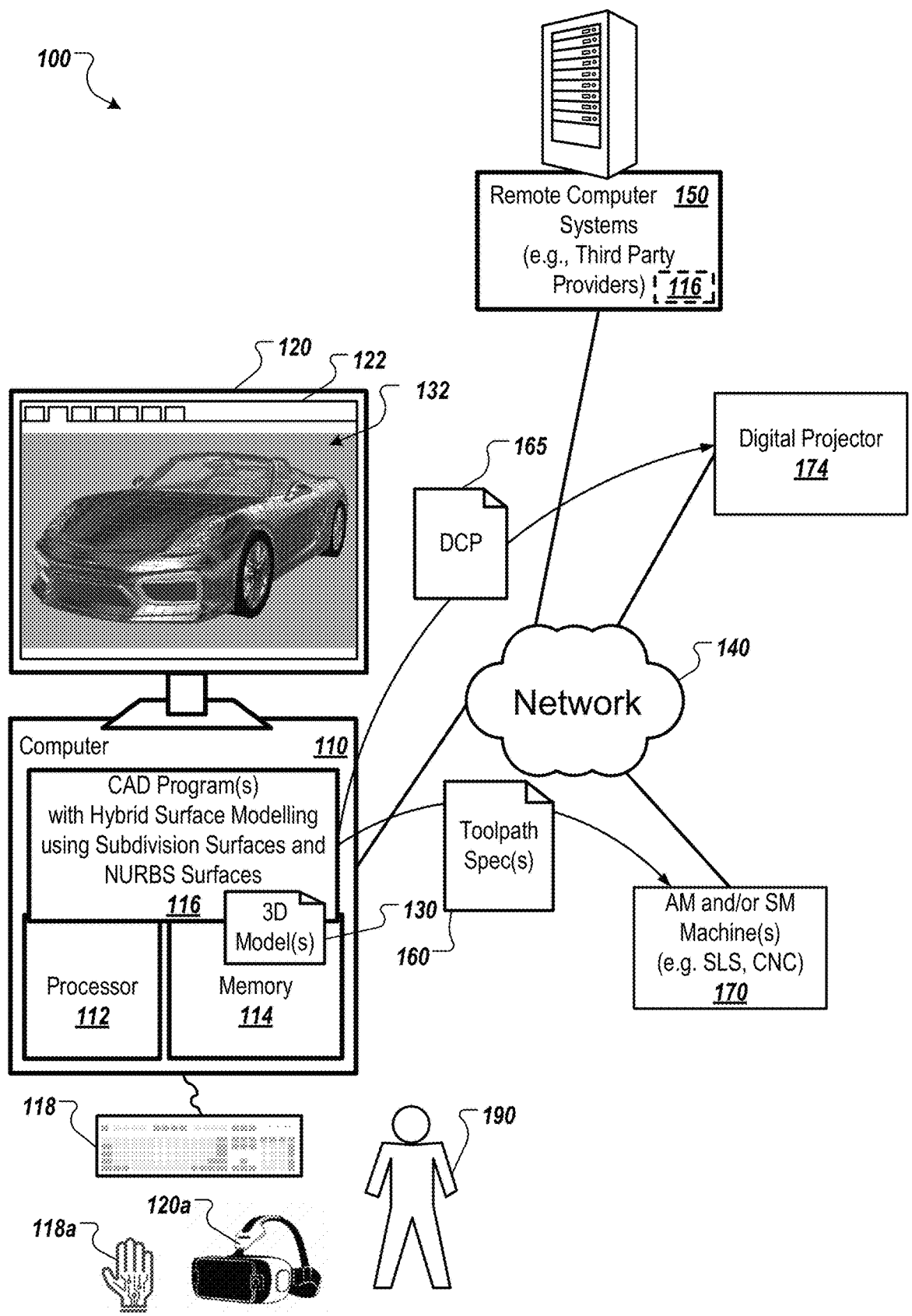
FIG. 1 shows an example of a system usable to design and manufacture physical structures and/or generate computer animation using a hybrid of subdivision surface and NURBS modelling techniques.

FIG. 1 shows an example of a system 100 usable to design and manufacture physical structures and/or generate computer animation using a hybrid of subdivision surface and NURBS modelling techniques. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112, including Computer Aided Design (CAD) program(s) 116, which implement three-dimensional (3D) modeling functions, including a hybrid subdivision surface modeling technique that employs NURBS surfaces as the limit surface of the subdivision surface.

As used herein, CAD refers to any suitable program used to design physical structures that meet specified design requirements, regardless of whether or not the program is capable of interfacing with and/or controlling specific manufacturing equipment. Thus, CAD program(s) 116 can include Computer Aided Industrial Design (CAID) program(s), Computer Aided Engineering (CAE) program(s), Computer Aided Manufacturing (CAM) program(s), etc. The program(s) 116 can run locally on computer 110, remotely on a computer of one or more remote computer systems 150 (e.g., one or more third party providers' one or more server systems accessible by the computer 110 via the network 140) or both locally and remotely. Thus, a CAD program 116 can be two or more programs that operate cooperatively on two or more separate computer processors in that a program 116 operating locally at computer 110 can offload processing operations (e.g., subdivision surface and/or NURBS processing) "to the cloud" by having one or more programs 116 on one or more computers 150 perform the offloaded processing operations.

The CAD program(s) 116 present a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer (e.g., a touch screen can be an input/output device 118, 120). Moreover, the computer 110 can include or be part of a virtual reality (VR) or augmented reality (AR) system. For example, the input/output devices 118, 120 can include a VR/AR input glove 118a and/or a VR/AR headset 120a.

As noted above, the CAD program(s) 116 implement 3D modeling functions, which means a 3D model 132 can be built using the CAD program(s) 116. The CAD program(s) 116 can implement physical simulation (locally and/or by remote procedure call) to assist in building the 3D model 132. Physical simulations, such as FEA, Computational Fluid Dynamics (CFD), Acoustics/Noise Control, thermal conduction, and/or computational injection molding simulations are often integral components in CAD-based product development. The CAD program(s) 116 can be used to build precise geometric descriptions of the design model, while physical simulations enable improved performance without time consuming physical testing.

The CAD program(s) 116 can provide user interface elements that enable the user to specify inputs for physical simulation(s), such as materials and loading cases for the 3D model(s) 132, where the loading cases define loads in different directions to be borne by a part being designed during use of the part. Thus, a user 190 can interact with the UI 122 of the CAD program(s) 116, including producing a full mechanical problem definition for a part to be manufactured, so as to build and modify 3D model(s) 132, which can be stored in 3D model document(s) 130. In the example of FIG. 1, the 3D model 132 is of a specific car design, but this is merely one of many possible 3D models that can be designed using the systems and techniques described herein.

In the example shown, the 3D model 132 rendered to the display device 120 in the UI 122 shows both the subdivision surface control mesh and NURBS surfaces generated therefrom. As described in further detail below, the user 190 is enabled by the CAD program(s) 116 to both create and edit subdivision surface control meshes, and also edit NURBS surfaces produced automatically by the CAD program(s) 116 from each subdivision surface control mesh. The CAD program(s) 116 integrate one or more subdivision surface modeling techniques with one or more NURBS modelling techniques to make it easier and more intuitive for the user 190 to create new 3D models. This integration can remove topological limitation(s) of modeling with NURBS (e.g., initial surface design by the user 190 need not be limited to four sided patches) and can also remove limitation(s) of modelling with subdivision surfaces (e.g., lack of support for advanced NURBS modeling tools such as surface trimming). In addition, in some implementations, the integrated modelling techniques can facilitate the rapid production of high quality (Class A) surfaces, eliminating discontinuities and dense control vertices (CV) distribution around star points in the 3D model.

Note that many technical surfacing applications, such as automobile design, require high quality Class A surfaces, where the complex surface generated for display or manufacturing is curvature continuous ($G^2$ continuity) across all regions of the complex surface. In some implementations, the limit surface is generated for the subdivision surface using a subdivision surface modeling technique that produces a curvature continuous limit surface across the entirety of a complex surface, including across star points. For example, the CAD program(s) 116 can produce surface patches for the limit surface of the subdivision surface as described in U.S. patent application Ser. No. 16/837,690, "PRODUCING OVERALL CURVATURE CONTINUOUS SURFACES FROM SUBDIVISION SURFACE MESHES", filed on Apr. 1, 2020, now published as US-2020-0320785-A1, and as described in U.S. Provisional Patent Application No. 62/828,127, "PRODUCING OVERALL CURVATURE CONTINUOUS SURFACES FROM SUBDIVISION SURFACE MESHES", Apr. 2, 2019, which are both hereby incorporated by reference.

The subdivision surface and NURBS portions of the 3D model 132 are integrated by the CAD program(s) 116 such that the user 190 can readily switch between editing the subdivision surface control mesh and the NURBS produced therefrom as the limit surface of the subdivision surface. The CAD program(s) 116 can combine the topological information from the subdivision surface modeling with the NURBS surfaces at the limit surface to enable editing of the subdivision surface using native NURBS modeling algorithms. In some implementations, all the NURBS surfaces tools (e.g., modeling, evaluation, visualization, and downstream data processing) of the CAD program(s) 116 can operate on the subdivision surface limit surface geometry. Note that separate editing modes or workspaces are not required, as direct surface modeling tools can be used directly on the limit surface of the subdivision surface model. Thus, the subdivision surface editing and the NURBS surface editing are not isolated from each, forcing extra conversion steps to allow the user 190 to switch between editing the subdivision surface control mesh and editing the limit surface therefor. Rather, a fully hybrid workflow is enabled, i.e., switching between editing types (subdivision surface control mesh editing versus NURBS surfaces editing) without any intermediate workflow steps by the user 190, making the user experience seamless.

In addition, in some implementations, the CAD program(s) 116 implement manufacturing control functions. Once the user 190 is satisfied with a 3D model 132, the 3D model 132 can be stored as the 3D model document(s) 130 and/or used to generate another representation of the model (e.g., an .STL file for additive manufacturing). This can be done upon request by the user 190, or in light of the user's request for another action, such as sending the 3D model 132 to additive manufacturing (AM) machine(s) and/or subtractive manufacturing (SM) machine(s) 170, or other manufacturing machinery, which can be directly connected to the computer 110, or connected via a network 140, as shown. This can involve a post-process carried out on the local computer 110 or a cloud service to export the 3D model 132 to an electronic document from which to manufacture. Note that an electronic document (which for brevity will simply be referred to as a document) can be a file, but does not necessarily correspond to a file. A document may be stored in a portion of a file that holds other documents, in a single file dedicated to the document in question, or in multiple coordinated files.

In any case, the CAD program(s) 116 can provide a document 160 (having toolpath specifications of an appropriate format) to an AM and/or SM machine 170 to produce a physical structure corresponding to at least a portion of the 3D model 132. An AM machine 170 can employ one or more additive manufacturing techniques, such as granular techniques (e.g., Powder Bed Fusion (PBF), Selective Laser Sintering (SLS) and Direct Metal Laser Sintering (DMLS)), extrusion techniques (e.g., Fused Deposition Modelling (FDM), which can include metals deposition AM). In some cases, the AM machine 170 builds the physical structure directly, and in some cases, the AM machine 170 builds a mold for use in casting or forging the physical structure. In addition, the user 190 can save or transmit the 3D model 132 for later use. For example, the CAD program(s) 116 can store the document(s) 130 that includes the 3D model 132.

An SM machine 170 can be a Computer Numerical Control (CNC) milling machine, such as a multi-axis, multi-tool milling machine used in the manufacturing process. For example, the CAD program(s) 116 can generate CNC instructions for a machine tool system 170 that includes multiple tools (e.g., solid carbide round tools of different sizes and shapes, and insert tools of different sizes that receive metal inserts to create different cutting surfaces) useable for various machining operations. Thus, in some implementations, the CAD program(s) 116 can provide a corresponding document 160 (having toolpath specifications of an appropriate format, e.g., a CNC numerical control (NC) program) to the SM machine 170 for use in manufacturing the physical structure using various cutting tools, etc.

In some implementations, the CAD program(s) 116 provide instructions to build a workpiece in a first stage of manufacturing, e.g., using direct AM and/or using forging and/or casting methods, and the CAD program(s) 116 also provide instructions to machine the workpiece, e.g., roughing and/or finishing operations, in a second stage of manufacturing, e.g., in a 3-axis CNC milling system, in order to form the completed structure. In general, various different manufacturing systems and techniques can be employed, either alone or in combination, to produce a final structure, and the CAD program(s) 116 can include suitable algorithms to generate toolpath specifications 160 for one or more of these various systems to manufacture a part that has been designed using the systems and techniques described in this application.

In addition, in some implementation, no physical manufacturing is involved. The systems and techniques described herein are applicable to any suitable surface modelling software, which supports history, as described in further detail below. Thus, in some implementations, the CAD program(s) 116 can be animation production programs that render the 3D model 132 to a document 165 of an appropriate format for visual display, such as by a digital projector 174 (e.g., a digital cinema package (DCP) 165 for movie distribution) or other high resolution display device. Other applications are also possible.

Figure 2:
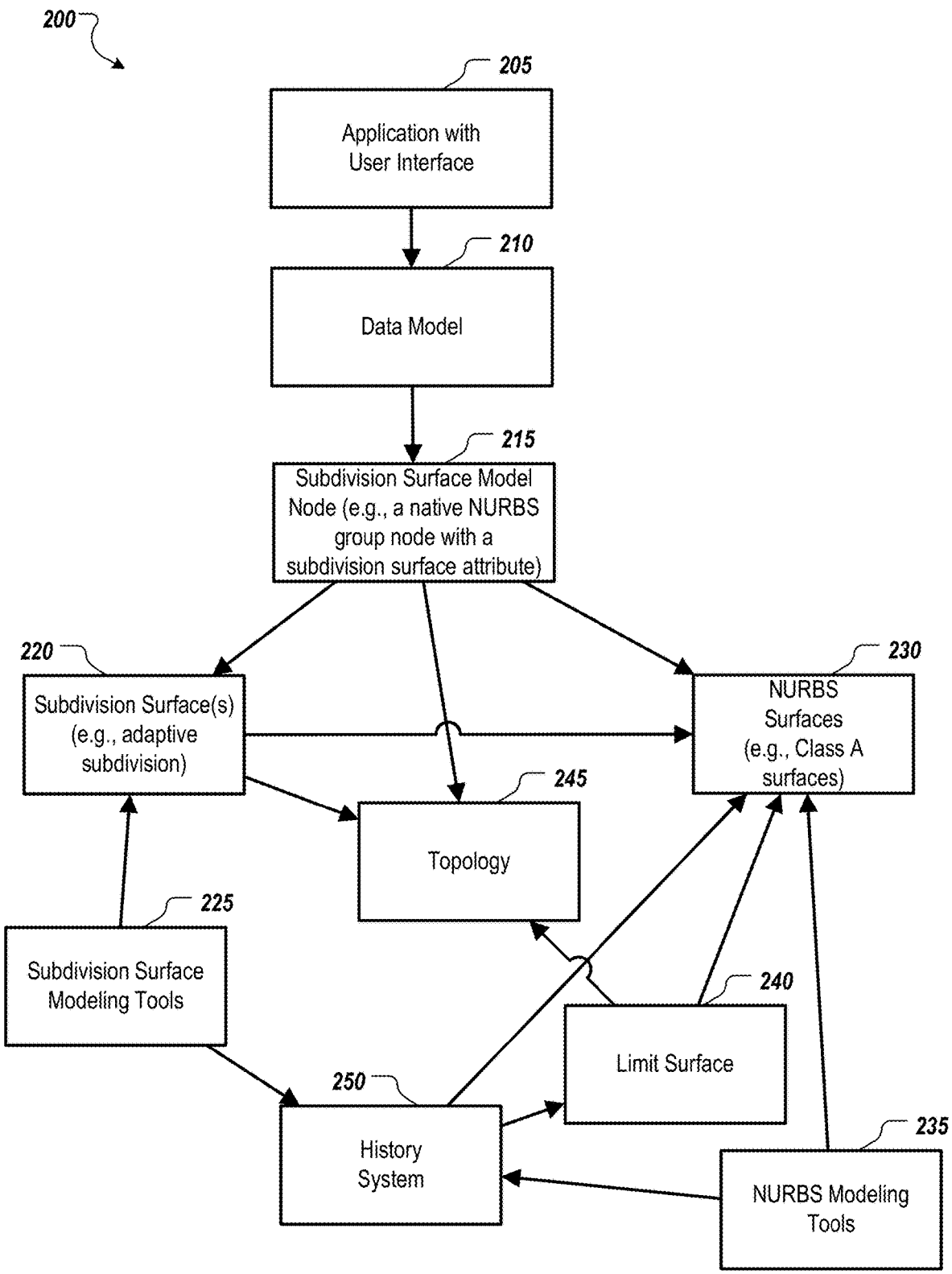
FIG. 2 shows an example of a program architecture to provide hybrid modelling of surfaces using subdivision surface and NURBS modelling systems and techniques.

FIG. 2 shows an example of a program architecture 200, e.g., employed by the CAD program(s) 116, to provide hybrid modelling of surfaces using subdivision surface and NURBS modelling systems and techniques. The program architecture 200 includes an application 205, which provides a user interface for the user to access the 3D modeling tools, and a data model 210. The data model 210 can support direct surface modeling by the application 205 using NURBS surfaces, and potentially other surface modeling formats, such as T-Splines. Regardless of the other modeling formats used, the provision of a direct surface modeler with a data model 210 that uses NURBS surfaces as the native data type (i.e., geometric modeling with NURBS) provides significant benefits, as NURBS are a widely used mature technology. NURBS surfaces can be high quality (Class A or "technical" surfaces) used in many 3D modeling contexts, such as in automotive design.

In addition, the data model 210 can be extended to include a subdivision surface model node 215 data type, where the limit surface of the subdivision surface is realized as a set of NURBS surfaces that are directly editable by the direct modelling surfacer of the application 205. Thus, an instantiation of the subdivision surface model node 215 includes both one or more subdivision surfaces 220, which are directly editable using subdivision surface modeling tools 225, and NURBS surfaces 230, which are directly editable using NURBS modeling tools 235. In some implementations, the subdivision surface algorithm provides adaptive subdivision, where the subdivision level is varied across the surface model. For example, the subdivision surface algorithm can be OpenSubdiv available from PIXAR®; OpenSubdiv is capable of computing the limit surface 240 as a set of mostly continuous bi-cubic Bézier patches having a topology 245.

All edits of the 3D model, both those done using subdivision surface modeling tools 225 and those done using NURBS modeling tools 235, are kept track of by a history system 250 as procedures performed on the 3D model. The history system 250 supports undo and redo functionality within the application 205, but also facilitates the integration of the two types of surface representations in a hybrid modeling surface, where the limit surface 240 is exposed as native NURBS 230 data type to the applications data model 210 along with topological information. The history system 250 keeps track of the geometric modifications performed on the 3D model as history procedures called on portions of the 3D model. Thus, edits to a NURBS surface 230 using a NURBS modelling tool 235 is reported to the history system 250, which in turn can update other NURBS surface(s) 230 in response thereto. The inputs to history commands in the history system 250 include geometric entities, like curves, surfaces, etc. Note that the inputs to a history command can include parameters in addition to geometric entities, the output of the history command is one or more geometric entities, which can in turn be input(s) to additional history command(s). In any case, if a surface changes, the history system 250 is notified and has to do something about it, like re-compute, throw an error, or take another action according to the situation.

In addition, this same history update mechanism can be employed as an update mechanism for integrating the computation of the limit surface with the native NURBS. When edits to a subdivision surface 220 control mesh are made using a subdivision surface modeling tool 225, this is reported to the history system 250, which in turn causes the limit surface 240 to be updated, along with an needed updates to topology 245, and also causes the creation, modification, and/or deletion of one or more NURBS surfaces 230 responsive to the changes to the control mesh of the subdivision surface. Moreover, if a NURBS surface 230 was previously edited using one or more NURBS modelling tools 235, and that NURBS surface 230 is modified by the edit to the subdivision surface 220 control mesh using one or more subdivision surface modeling tools 225, all the previous modification to the old version of the NURBS surface 230 are reapplied by the history system 250 to the new NURBS surface 230 generated by the edit to the subdivision surface 220.

In other words, when the input mesh of the subdivision surface 220 is changed, the limit surface 240 is updated, the NURBS surfaces 230 get refreshed, the history system 250 is notified that the NURBS surfaces 230 inputs have been changed, and so the history system 250 takes action and re-executes the procedures to perform the geometric modifications (as previously specified for the old versions of the NURBS surfaces 230) to the new versions of the NURBS surfaces 230. For example, if the user previously aligned a first NURBS surface 230 with a second NURBS surface 230, when the limit surface 240 gets updated, the align procedure will take the new version of the first NURBS surface 230 and re-align it with the second NURBS surface 230 without the user having to provide any input with a NURBS modeling tool 235.

As will appreciated, re-execution of the NURBS modeling procedures may not be possible in all cases. For example, when the topology changes 245, a NURBS surface 230 that had geometric modifications applied to it previously may be deleted entirely after the edit to the subdivision surface. In such cases, the application 205, e.g., CAD program(s) 116, can take additional steps to prevent data loss, such as creating template surfaces so the user doesn't lose those previous modifications. For example, in the case of projection and trimming, the history can react to the changes and either delete the projection history (if the surfaces get deleted), or if the projections fail (because they fall outside the surfaces) the history command can take action and mark those projections as invalid, preventing the history command from being deleted. If the user makes further modifications, which make the projections possible again, the history command can re-project and restore the trimming information. Also, the project, trim, intersect and other NURBS modeling tools can take advantage of the topological structure of the limit surface and enable advanced modeling workflows on complex surfaces. For example, the trim tool can take as input the whole limit surface (which is a collection of NURBS surfaces and the topology) to trim multiple NURBS surfaces in one operation, greatly simplifying the workflow.

As noted, the output of the subdivision surface modeling is a native NURBS data type within the data model 210, so the subdivision surface model node 215 can be fully backward compatible with all the existing NURBS modeling tools 235, allowing direct surface modeling of Class A surfaces in a subdivision surface. Note that the code implementing the NURBS modeling tools 235 need have no information indicating that the NURBS surfaces 230 are part of the subdivision surface 220. In some implementations, the subdivision surface model node 215 is implemented using a NURBS group node, which is a collection of nodes that are surfaces, curves, etc. The subdivision surface data structure containing the NURBS surfaces 230 are the same as prior NURBS group node data structures, but the group node 215 also includes a subdivision surface attribute. This subdivision surface attribute can contain the control mesh of the subdivision surface 220 and also a topological control structure that tracks relationships between the topology 245 of the control mesh and NURBS surfaces 230 that correspond to the limit surface 240. Thus, the subdivision surface attribute of the group node holds the information used to keep track of the subdivision surface input parameters and the relationships between the subdivision surface input and the NURBS surfaces in the data model (e.g., mappings between the NURBS surfaces 230 and the faces of the control mesh of the subdivision surface 220 and its topology 245).

This approach can facilitate backward compatibility and data exchange with other applications. For example, the subdivision surface 220 in the attribute of the group node 215 can be stored in an industry standard data format for subdivision surface models and thus can be directly exported to another application, even if that other application doesn't support NURBS surfaces. Likewise, the NURBS surfaces 230 in the group node 215 can be stored in an industry standard data format for NURBS surface models and thus can be directly exported to another application, even if that other application doesn't support subdivision surfaces.

Figure 3A:
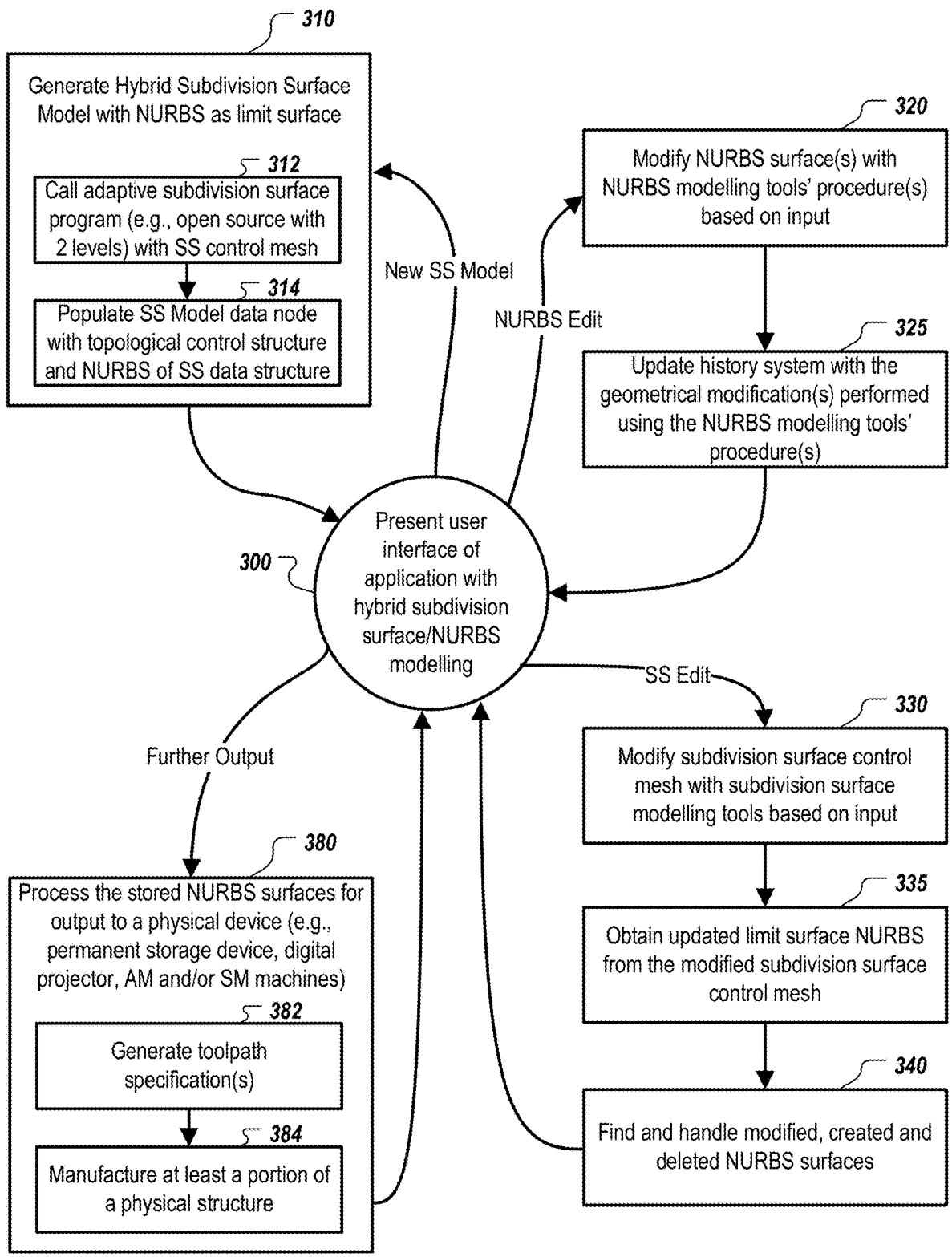
FIG. 3A shows an example of a process to produce and use hybrid 3D models employing both subdivision surface and NURBS techniques.

FIG. 3A shows an example of a process, e.g., performed by CAD program(s) 116, to produce and use hybrid 3D models employing both subdivision surface and NURBS techniques. A user interface of a 3D modeling application is presented 300 to the user, where the application includes hybrid subdivision surface/NURBS modelling functions. Input is received to generate a new subdivision surface model, which can be part of larger 3D model in the application. The input can be provided through subdivision surface (SS) modeling tools provided in the user interface, e.g., new SS model input received through subdivision surface modelling tools 225, but a hybrid subdivision surface model with NURBS surfaces as the limit surface is generated 310, as described herein.

For example, an adaptive subdivision surface program (e.g., Open Subdiv) can be called 312 with the subdivision surface control mesh defined by the received input. Various levels of subdivision are possible, including more than two levels of adaptive subdivision. In some implementations, the subdivision of the control mesh is limited to two levels, e.g., adaptive subdivision with a maximum of two levels of subdivision. The output surface patches from the subdivision surface method (e.g., from the adaptive subdivision surface program) can then be processed to produce NURBS surfaces.

The output of the subdivision surface algorithm can be a collection of bi-cubic Bézier patches (one span NURBS that are cubic, 3×3). These surfaces can then be post processed to fix the continuity between them. Note that in some applications, e.g., automotive design, continuity is very important, and so removal of discontinuities around star points in the limit surface is advantageous, and so multi-span NURBS surfaces can be produced for the limit surface with $G^2$ continuity at star points on the limit surface. For example, the processing of the output surface patches can employ the systems and techniques described in U.S. Provisional Patent Application No. 62/828,127, "PRODUCING OVERALL CURVATURE CONTINUOUS SURFACES FROM SUBDIVISION SURFACE MESHES", Apr. 2, 2019.

In addition to generating 310 the NURBS surfaces as the limit surface for the subdivision surface model, a topological control structure is generated 310, where the topological control structure tracks relationships between respective portions of the control mesh of the subdivision surface and the NURBS surfaces representing the limit surface of the subdivision surface. The NURBS surfaces can each have one or more associated history procedures, which are geometric modifications of the NURBS surfaces, e.g., managed through the history system 250, and the subdivision surface model can also be managed using the same history mechanism. The NURBS surfaces can be stored together with the topological control structure in a subdivision surface data structure. For example, a subdivision surface model node in the data model can be populated 314 with both the topological control structure (e.g., in an attribute of the data node) and the stored NURBS surfaces (e.g., in a NURBS group node in the data model 210). Thus, the subdivision surface can sit on top of the native NURBS surfaces and keep them together by keeping track of all the topology, all the surfaces, which ones are neighbors to which, etc., and being able to know when and which ones to update when it executes.

The handling of the hybrid data model allows modification of a complex surface through either the subdivision surface definition or the NURBS definition of that complex surface (without conversion). The user has access to both the subdivision surface definition of the surface overall and the control vertices of the NURBS at the limit surface. Thus, NURBS editing input can then be received, e.g., a NURBS edit received using NURBS modelling tools 235, and one or more NURBS surfaces can be modified 320 based on the input, e.g., fillet, align, project, trim, etc. For example, the user can move a control point, and the program can identify which surface(s) (including neighboring surfaces) are affected. In addition, one or more procedures (geometric modifications corresponding to the edits) are associated 325 with the history for the edited NURBS surface(s), e.g., history system 250 is updated 325 with the geometric modification(s) performed using the NURBS modelling tools 235.

This tracking through a procedural history system of both the NURBS surfaces relationships with the control mesh of the subdivision surface and the modifications made to the NURBS surfaces representing the limit surface of the subdivision surface, allows editing through either the subdivision surface definition or the NURBS definition of the complex surface in a unified workflow for the user. Thus, for example, the user can trim a subdivision surface by using a traditional trimming tool on one or more NURBS surfaces tracked as the limit surface of the subdivision surface. Moreover, after such edits of the NURBS surfaces, the user can modify the control mesh of the subdivision surface, and prior trimming (e.g., some curves projected on the limit surface) can be re-applied to the newly generated NURBS limit surface(s) through the same data model that handles NURBS surfaces as a native data type for the NURBS modeler. Thus, all the NURBS tools (e.g., project, trim, align, fillet, etc.) can operate on the subdivision surface through the NURBS surfaces representation of the limit surface. Note that the NURBS modeler need have no information indicating that the NURBS surfaces are produced by a subdivision surface model.

Thus, input to modify the subdivision control mesh is received, e.g., an SS edit using subdivision surface modelling tools 225, and in response to this input, the control mesh is modified 330 in accordance with the input to form a modified control mesh, and an updated limit surface is obtained 335 from the modified control mesh. This involves using a subdivision surface algorithm and processing the output therefrom, as described above for generating 310. In addition, when the subdivision surface is re-computed, the program will know which surfaces have changed during the operation. If the change is a topological change, those surfaces that have been created and those surfaces that have been deleted are known, along with which surfaces have been modified. The created, deleted and modified surfaces can be found in accordance with one or more of the relationships tracked by the topological control structure. Thus, the subdivision surface model has all the data needed to keep track of all the surfaces in the data model that have to be updated, created or deleted as part of the operation on the control mesh, and so each modified, created and/or deleted NURBS surface is found and handled 340.

Figure 3B:
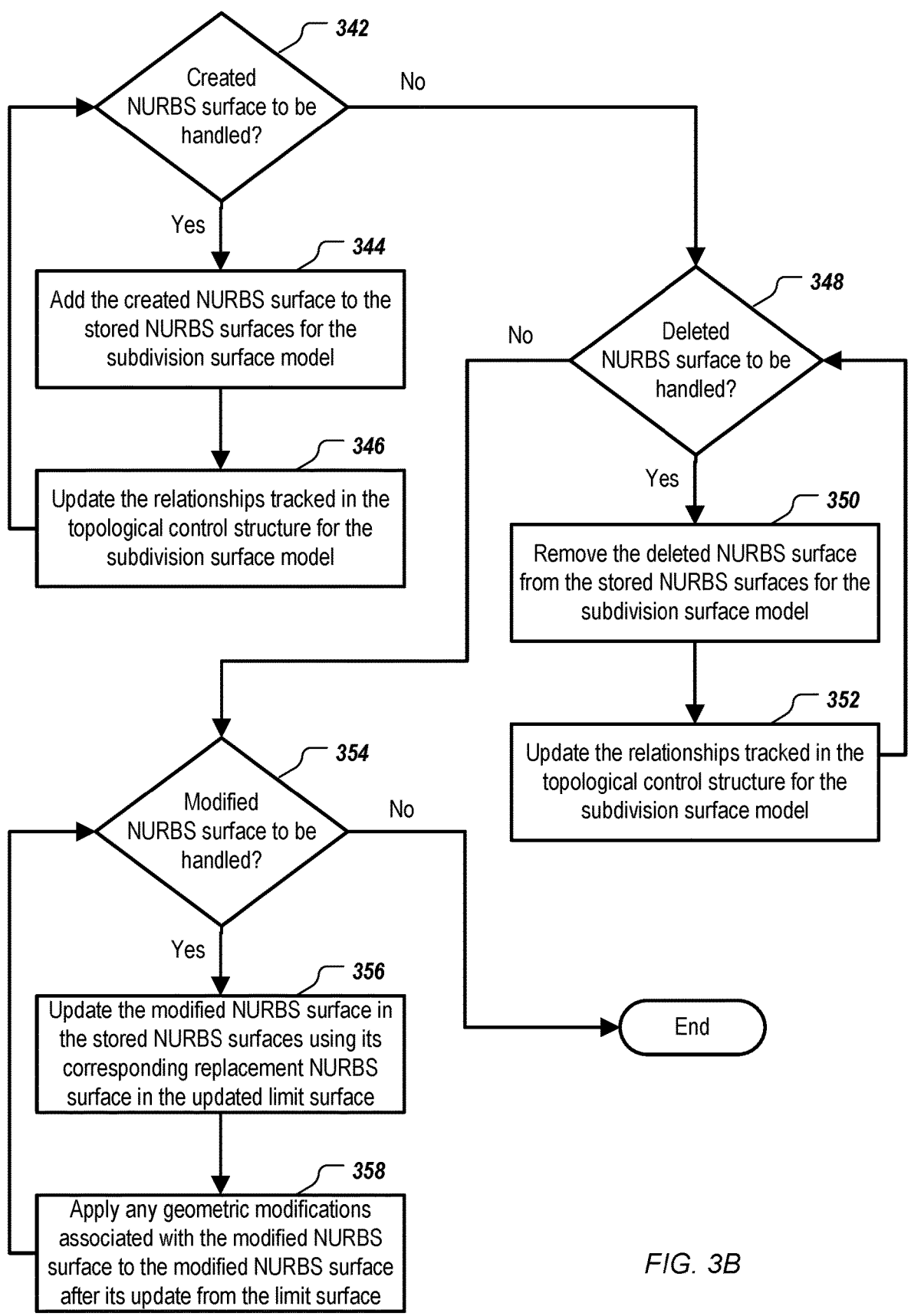
FIG. 3B shows an example of a process to handle modified, created and deleted NURBS surfaces resulting from a modification to a control mesh of a subdivision surface model.

FIG. 3B shows an example of a process to handle modified, created and deleted NURBS surfaces resulting from a modification to a control mesh of a subdivision surface model. A check 342 is performed to identify any NURBS surfaces created by the mesh change, which NURBS surfaces have yet to be handled. Each created NURBS surface is added 344 to the stored NURBS surfaces for the subdivision surface model, and the relationships tracked in the topological control structure are updated 346 for the subdivision surface model. This process repeats until all the created NURBS surfaces have been handled.

A check 348 is performed to identify any NURBS surfaces deleted by the mesh change, which NURBS surfaces have yet to be handled. Each deleted NURBS surface is removed 350 from the stored NURBS surfaces for the subdivision surface model, and the relationships tracked in the topological control structure are updated 352 for the subdivision surface model. This process repeats until all the deleted NURBS surfaces have been handled.

A check 354 is performed to identify any NURBS surfaces modified by the mesh change, which NURBS surfaces have yet to be handled. Each modified NURBS surface in the stored NURBS surfaces for the subdivision surface model is updated 356 using its corresponding replacement NURBS surface in the updated limit surface (an "in-place copy"), and any geometric modifications (tracked through the relationships in the topological control structure, e.g., using the history system 250) are applied 358 to the updated NURBS surface. For example, any CV changes applied previously to a stored NURBS surface for the limit surface are reapplied to the updated version of this same stored NURBS surface after it has been updated in response to the subdivision surface control mesh change. This process of updating the modified NURBS surfaces repeats until all the modified NURBS surfaces have been handled.

Returning to FIG. 3A, the user is free to make edits to either the subdivision surface definition of the model of the complex surface or the NURBS surfaces at the limit surface, in any order and directly through the same user interface, which was not possible in prior 3D computer modelling programs. Thus, for example, the user can apply a crease to an edge or a loop edge of a subdivision surface and then go ahead and fillet that crease. Moreover, the produced result can be a Class A fillet with form factor, etc. And the user is free to then start pulling control vertices on the subdivision surface mesh, and the fillet will be updated as though it is part of the subdivision surface even though it is not strictly speaking part of the subdivision surface, but rather is part of the subdivision surface model tracked using the history mechanism. From the user's perspective, they are one and the same because of the tight integration between the two definitional formats for the complex surface.

In addition, the user can trigger further output, in addition to the rendering to the display in the user interface. In response, the stored NURBS surfaces of the limit surface are processed 380 for output by a physical device. The physical device can be a display device, e.g., display device 120, and the processing 380 can include rendering at least a portion of the stored NURBS surfaces to the display device, e.g., to allow the user to edit the subdivision surface model, such as described above. The physical device can be a permanent storage device, and the processing 380 can include rendering at least a portion of the stored NURBS surfaces to an output document stored in the permanent storage device, e.g., for use in manufacturing a physical structure corresponding to the modeled object using the one or more computer-controlled manufacturing systems, e.g., AM machine(s) and/or SM machine(s) 170, and/or other manufacturing machines. The physical device can be a digital projector, and the processing 380 can include rendering at least a portion of the stored NURBS surfaces to an animation document, e.g., DCP 165, for the digital projector, e.g., digital projector 174.

Moreover, the physical device can be one or more computer-controlled manufacturing systems including an additive manufacturing machine or a subtractive manufacturing machine, and the processing 380 can include causing manufacturing of at least a portion of the modeled object using the one or more computer-controlled manufacturing systems, e.g., AM machine(s) and/or SM machine(s) 170, and/or other manufacturing machines. For example, the processing 380 can include generating 382, e.g., by CAD program(s) 116, toolpath specifications for the computer-controlled manufacturing system(s) (e.g., AM machine(s) and/or SM machine(s) 170) using the 3D model, and manufacturing 384, e.g., by CAD program(s) 116, at least a portion of the physical structure corresponding to the modeled object with the computer-controlled manufacturing system(s) (e.g., AM machine(s) and/or SM machine(s) 170) using the toolpath specifications generated for the manufacturing machine (e.g., AM machine(s) and/or SM machine(s) 170).

The following is a detailed example, including pseudo code, of hybrid geometric modeling with subdivision surfaces and NURBS as described herein. This example includes the following components:

1. Subdivision Data type used to extend the DAG (Directed Acyclic Graph) Group node in the DataModel which contains:
   The input mesh, called a Cage, which in turn stores payloads containing:
   Per Face unique identifiers
   Per Edge crease value
   Per Vertex crease value
   Topology that links the Face, Edge and Vertex entities into a topological structure
   Data structure to store the mapping between the cage faces and the surface DAG nodes.
   Draw information for controlling the visual appearance
2. DataModel DAG nodes comprising of:
   The DAG Group node with the Subdivision Data attached and the Dag surface nodes as children nodes
   The Dag surface nodes holding the Limit Surface NURBS objects
3. The Adaptive Subdivision Surfaces algorithm, used to evaluate the Limit Surface directly, as a collection of cubic Bezier surfaces and the post processing algorithm to coalesce the patches and correct the discontinuities
4. The Limit Surface, which is a collection of NURBS objects, organized in a topological structure, representing a complex surface, used as a geometric entity for computations: projection, trimming, evaluation, intersections etc.
5. The procedural History, comprising of:
   A collection of procedures, called History commands which have:
   inputs as surface DAG nodes and a set value parameters
   outputs as surface DAG nodes
   the inputs and outputs can be the same Example Extrude a Polyline to create a Subdivision surface.
Create fillets and align surfaces using the Limit Surface DAG nodes as inputs and outputs.
Project curves on the Limit Surface and trim the surfaces.
Modify the Subdivision Cage and trigger a re-execution of the Subdivision Surfaces to recompute the Limit Surface and reexecute the History.
Pseudo Code:

---

*Create a DAG Group node
*Create a Subdivision Data object and attach it to the Group node
*Execute a Polyline extrusion algorithm, to create a Cage -continued

```
*Assign the Cage object to the Subdivision Data object
*Compute the Limit Surface:
  **Create the Adaptive Subdivision Surfaces algorithm
  **Convert the Cage topological structure from pointer to vectorized representation
  **Configure the Adaptive Subdivision Surfaces algorithm with the vectorized input
    mesh and the crease information, along with the face identifiers
  **Execute the Subdivision Surface algorithm
  **Extract the Limit Surface from the algorithm, as a collection of Bezier patches
    associated with the faces identifiers
  **For each Extraordinary Control Vertex, known as Star Point, find all the Bezier
    patches resulted from the Adaptive algorithm and coalesce them into multispan
    NURBS
  **Find the neighboring Limit Surface patches with discontinuities caused by the
    Adaptive subdivision approximation and apply the algorithm to modify the
    surfaces and correct the discontinuities
*Update the DataModel:
  **Find all the Limit Surface patches which have been created, deleted or modified
    caused by the Cage changes and group them accordingly
  **For each created patch:
    ***Create a surface DAG node and add it to the Subdivsion DAG Group node
    ***Copy the Limit Surface patch data into the surface of the surface DAG node
    ***Find the corresponding Cage Face, using the Face identifier and the Limit
       Surface result and update the Subdivsion Data mapping
  **For each deleted patch:
    ***Find the corresponding Cage Face using the Face identifier
    ***Find the surface DAG node corresponding to the patch
    ***Delete the DAG node in the DataModel
    ***Update the Subdivision Data mapping
  **For each modified patch:
    ***Find the corresponding Cage Face using the Face identifier
    ***Find the corresponding surface DAG node
    ***Replace the surface information in the DAG node with the patch
  **Update the topological information of the Limit Surface in the Subdivision
    Surface Data object
*Update History:
  **For each affected surface DAG node:
    ***Send a notification to the History system
    ***For each History command, check if the surface DAG node affects it, and
       mark itself ready for recomputation or destruction
    ***Delete the History commands marked for destruction
  **Trigger an execution of the History:
    ***For each marked History command, execute the command and update the
       DataModel with the results
      ****The Fillet command re-executes and updates the DAG node surfaces
         of the Fillet node
      ****The Align command re-executes and updates the DAG node surfaces
         belonging to the Subdivision Group node
      ****The Project command re-executes and updates the Curve on Surface
         on the Subdivision surfaces
      ****The Trim re-executes and recomputes the trimming on the
         Subdivision surfaces
```

Figure 4:
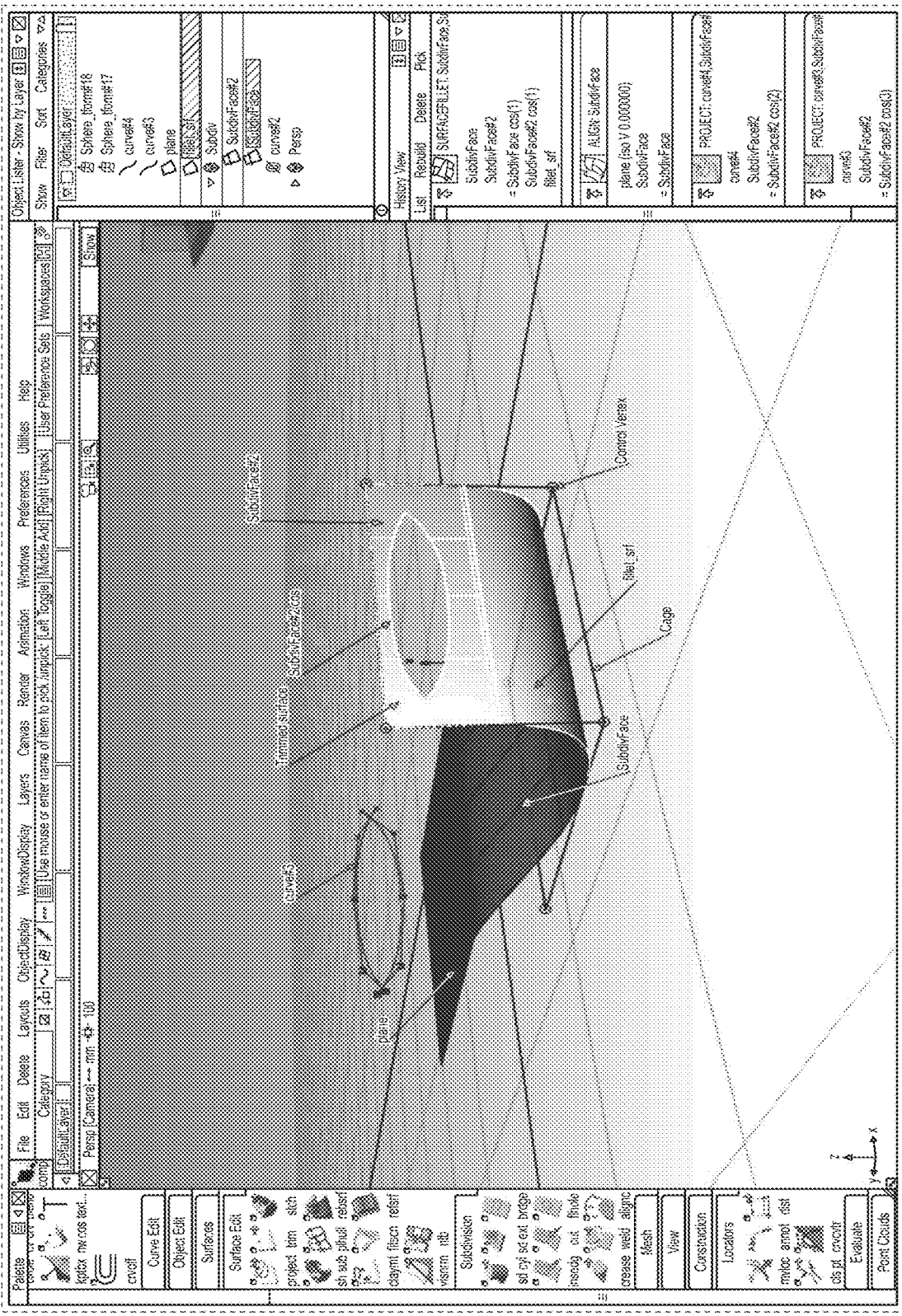
FIG. 4 shows a user interface screenshot with an example DataModel representation of the Subdiv data and the connection between the Subdiv surfaces and History inputs and outputs.
Figure 5:
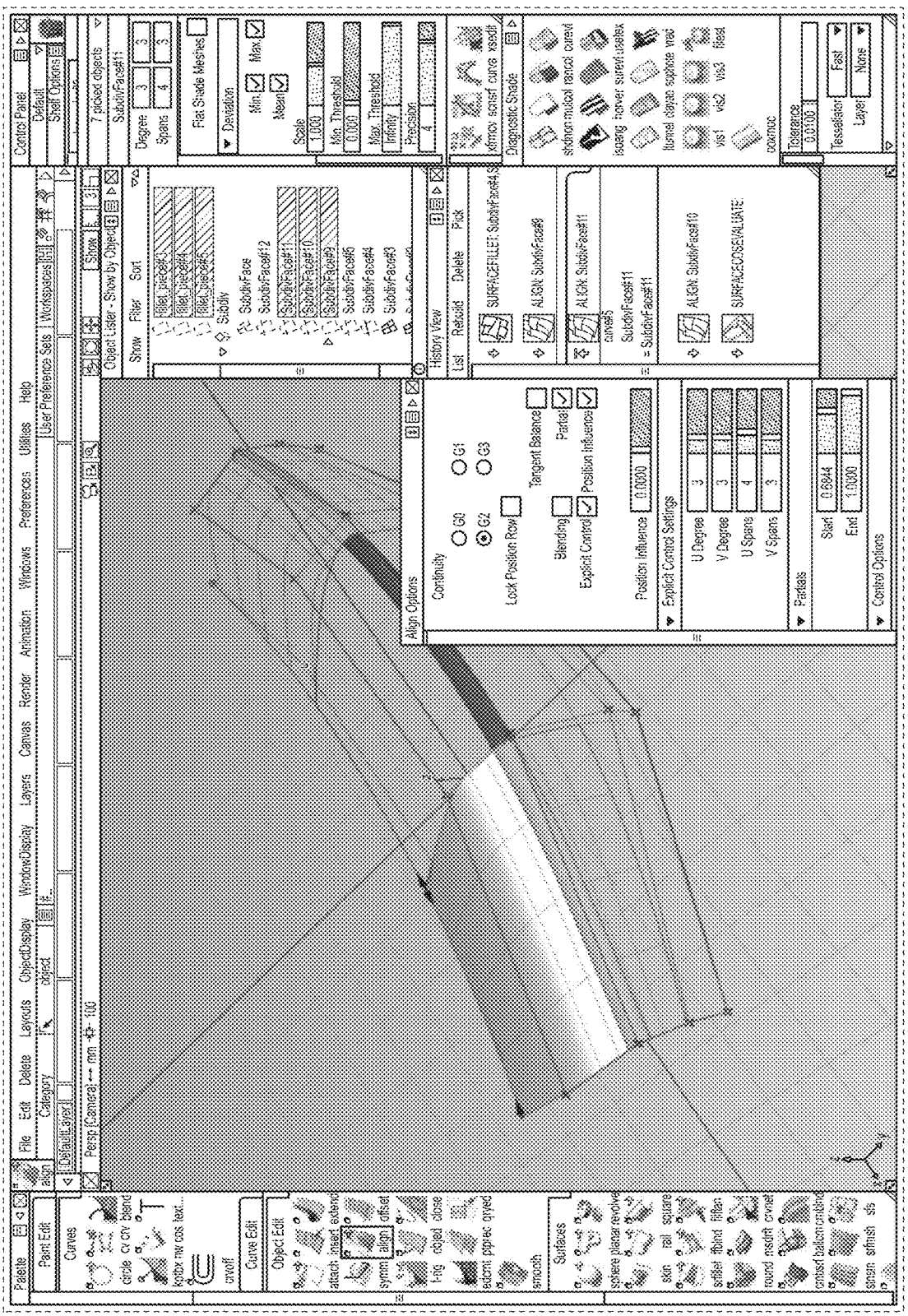
FIG. 5 shows a user interface screenshot with an example similar to that of FIG. 4, but with a bit more complex geometry, with a control mesh (cage) created by multiple extrusions, and a fillet that spans multiple Subdiv groups of continuous input surfaces.

FIG. 4 shows a user interface screenshot 400 with an example DataModel representation of the Subdiv data and the connection between the Subdiv surfaces and History inputs and outputs. In the Object Lister window, the Subdiv Group node and Subdiv faces as children nodes, which are native data types in the application DataModel, are shown. These include:

SubdivFace belongs to the Subdiv group node and it's geometry updates when the cage changes, by the limit surface computation SubdivFace and SubdivFace #2 are input to the FILLET-SURFACE History command and also output for CurveOnSurface and subsequent trimming SubdivFace is input and output to the ALIGN History command This example shows a deep integration of the Subdiv limit surface into the History system, without having to modify an existing History system, or the existing DataModel objects. SubdivFace is:

Computed by the Subdiv limit surface evaluation and part of the Subdiv limit surface Re-computed by the Align command Input for the Fillet command and output for the CurveOnSurface Output for trimming FIG. 5 shows a user interface screenshot 500 with an example similar to that of FIG. 4, but with a bit more complex geometry, with a control mesh (cage) created by multiple extrusions, and a fillet that spans multiple Subdiv groups of continuous input surfaces. Subdiv groups are of continuous input surfaces. The Align tool is a complex, Class-A NURBS tool operating on a Subdiv surface, without any input (to the Align tool) indicating the Subdiv limit surface type, so the user doesn't need to use the Align tools in any way different than on regular NURBS surfaces.

Figure 6A:
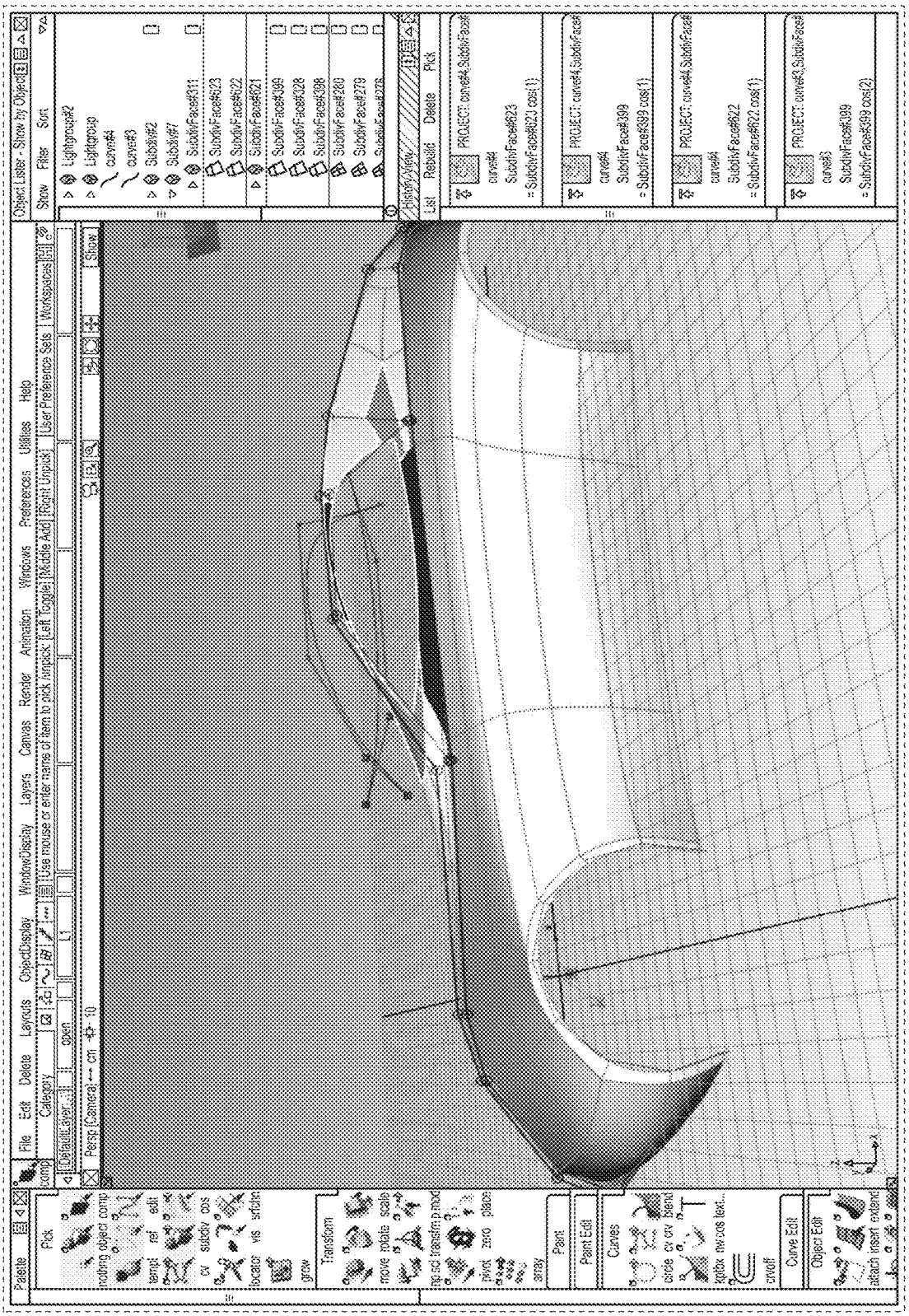
FIG. 6A shows a user interface screenshot with an example of a production car model.
Figure 6B:
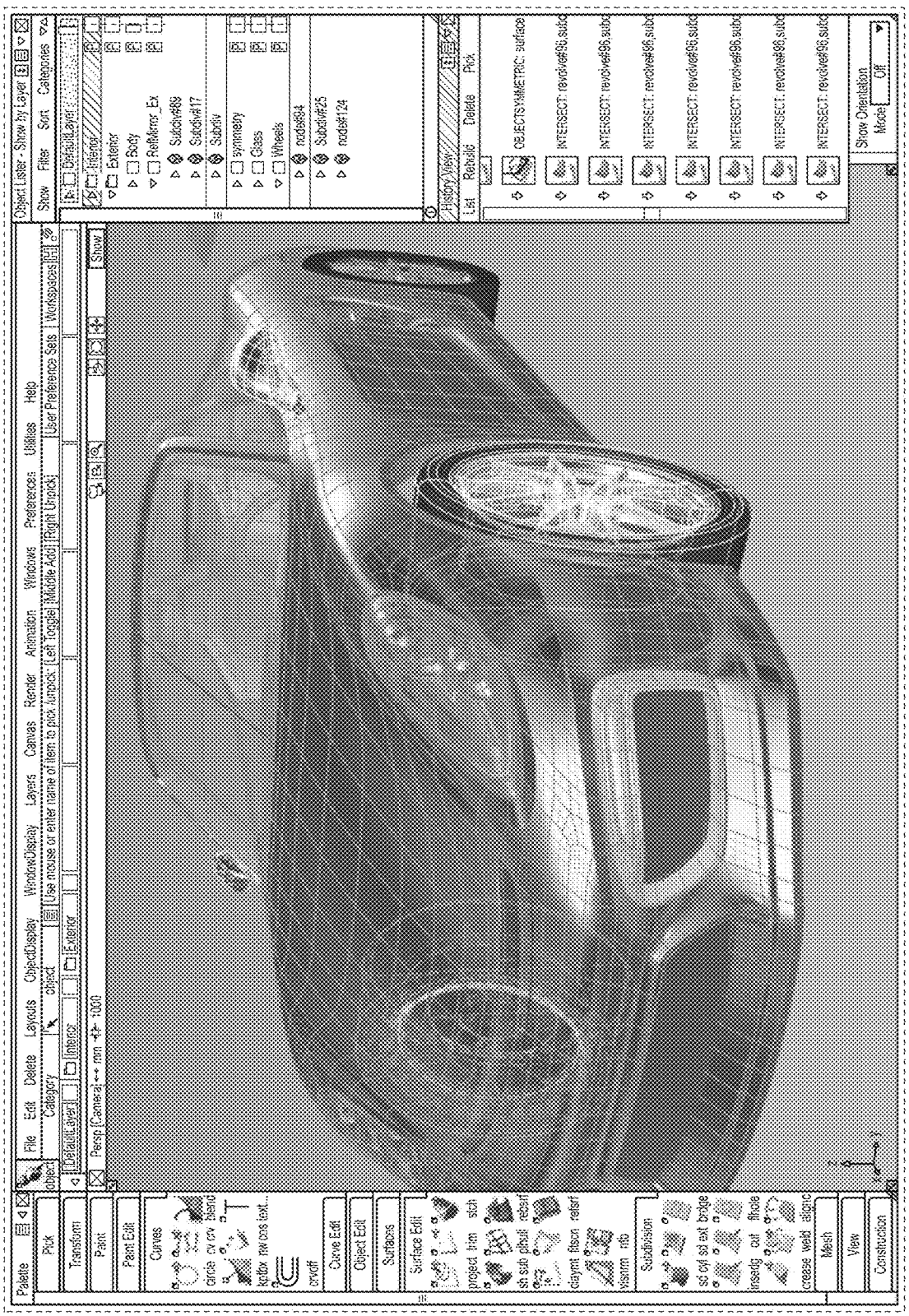
FIG. 6B shows a user interface screenshot with a production grade model created using the hybrid subdivision surface and NURBS surfaces modeling described herein.

FIG. 6A shows a user interface screenshot 600 with an example of a production car model. The curve #3 and curve #4 are projected onto the surfaces of the Subdiv #7 limit surface, the Project History command reacts to changes and updates the projections. The surfaces get trimmed, in effect trimming the limit surface of the Subdiv #7. A change in the geometry of the curves or the Subdiv cage will trigger a re-execution of the limit surface calculation and re-execution of the History commands, re-computing all the geometry, projections and trimming. FIG. 6B shows a user interface screenshot 650 with a production grade model created using the hybrid subdivision surface and NURBS surfaces modeling described herein. Highlighted are the Subdiv and node #94, which are pieces of geometry created with different modelling paradigms, Subdivision Surface and NURBS direct modelling, but they coexist in an integrated hybrid modelling paradigm.

Figure 7:
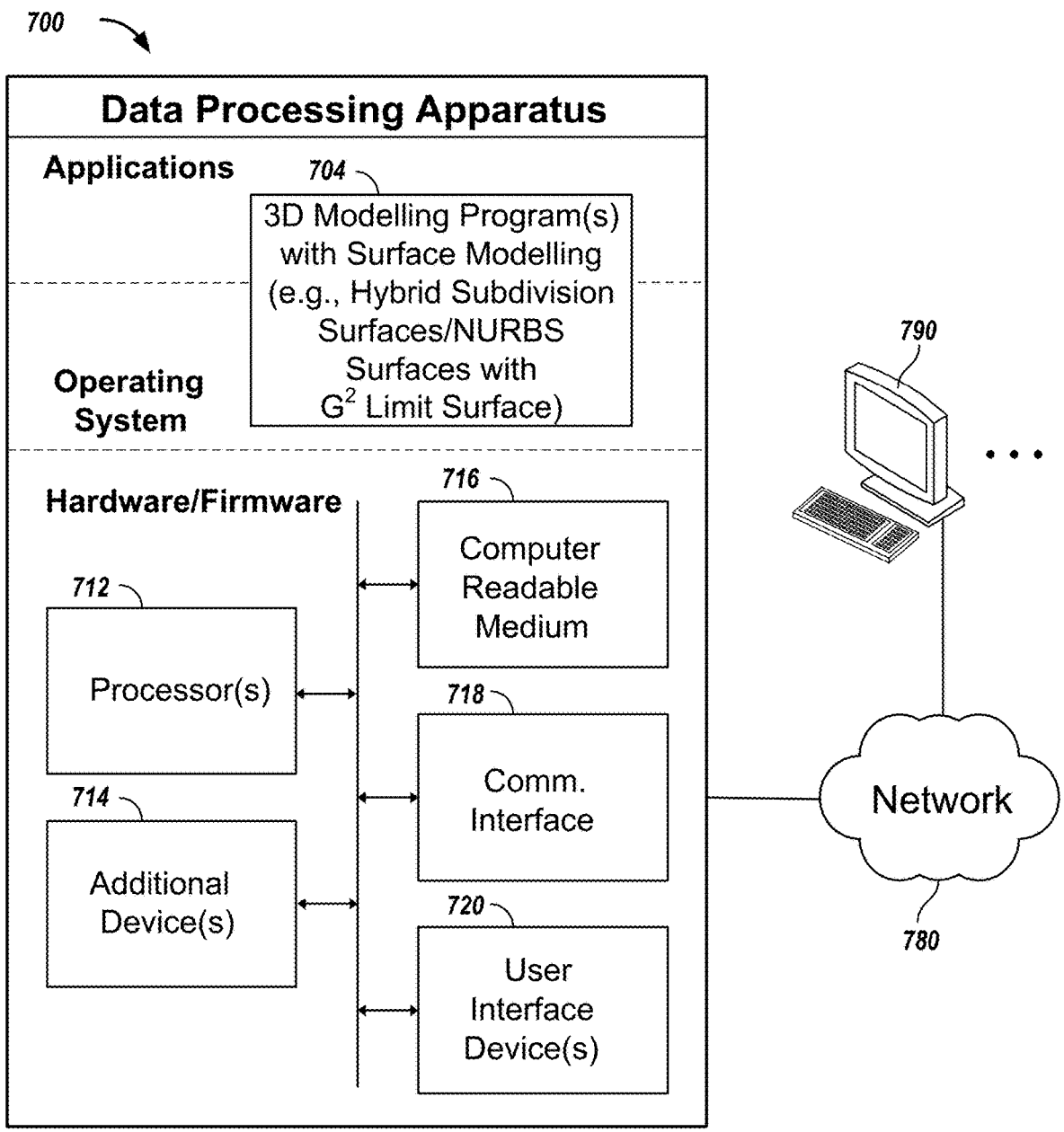
FIG. 7 is a schematic diagram of a data processing system including a data processing apparatus, which can be programmed as a client or as a server.

FIG. 7 is a schematic diagram of a data processing system including a data processing apparatus 700, which can be programmed as a client or as a server. The data processing apparatus 700 is connected with one or more computers 790 through a network 780. While only one computer is shown in FIG. 7 as the data processing apparatus 700, multiple computers can be used. The data processing apparatus 700 includes various software modules, which can be distributed between an applications layer and an operating system. These can include executable and/or interpretable software programs or libraries, including tools and services of one or more 3D modeling programs 704 that implement the systems and techniques described herein. Thus, the 3D modeling program(s) 704 can be CAD program(s) 704 that implement 3D modeling functions and hybrid surface modelling with subdivision surfaces and NURBS surfaces, and potentially also production of continuous ($G^2$) NURBS surfaces from arbitrary subdivision surface meshes.

Further, the program(s) 704 can implement physical simulation operations (finite element analysis (FEA) or other), generative design operations (e.g., using level-set based method(s) for generative design), manufacturing control operations (e.g., generating and/or applying toolpath specifications to effect manufacturing of designed objects), and/or movie animation production. The number of software modules used can vary from one implementation to another. Moreover, the software modules can be distributed on one or more data processing apparatus connected by one or more computer networks or other suitable communication networks.

The data processing apparatus 700 also includes hardware or firmware devices including one or more processors 712, one or more additional devices 714, a computer readable medium 716, a communication interface 718, and one or more user interface devices 720. Each processor 712 is capable of processing instructions for execution within the data processing apparatus 700. In some implementations, the processor 712 is a single or multi-threaded processor. Each processor 712 is capable of processing instructions stored on the computer readable medium 716 or on a storage device such as one of the additional devices 714. The data processing apparatus 700 uses the communication interface 718 to communicate with one or more computers 790, for example, over the network 780. Examples of user interface devices 720 include a display, a camera, a speaker, a microphone, a tactile feedback device, a keyboard, a mouse, and VR and/or AR equipment. The data processing apparatus 700 can store instructions that implement operations associated with the program(s) described above, for example, on the computer readable medium 716 or one or more additional devices 714, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, e.g., after delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that produces an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a browser user interface through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, actions recited in the claims can be performed in a different order and still achieve desirable results.

What is claimed is:

1. A method comprising:
   generating, by a computer aided design program, a subdivision surface model of a subdivision surface, the subdivision surface model comprising
      a topological control structure that tracks relationships between respective portions of a control mesh of the subdivision surface and stored NURBS surfaces representing a limit surface of the subdivision surface, and
      a subdivision surface data structure comprising the stored NURBS surfaces representing the limit surface;
   receiving, by the computer aided design program, a direct edit of at least one of the stored NURBS surfaces performed using a NURBS modeling tool, which forms at least one modified NURBS surface in the stored NURBS surfaces by application of one or more geometric modifications;
   associating, by the computer aided design program, the one or more geometric modifications, which correspond to the direct edit of the at least one of the stored NURBS surfaces, with the at least one modified NURBS surface;
   receiving, by the computer aided design program, input to modify the control mesh of the subdivision surface model of the subdivision surface;
   modifying, by the computer aided design program, the control mesh in accordance with the input to form a modified control mesh;
   obtaining, by the computer aided design program, an updated limit surface from the modified control mesh;
   finding, by the computer aided design program, the at least one modified NURBS surface in the stored NURBS surfaces in accordance with one or more of the relationships tracked by the topological control structure, the at least one modified NURBS surface having a replacement NURBS surface in the updated limit surface;
   updating, by the computer aided design program, the at least one modified NURBS surface in the stored NURBS surfaces with the replacement NURBS surface;
   applying, by the computer aided design program, the one or more geometric modifications to the at least one modified NURBS surface in the stored NURBS surfaces to reapply the direct edit previously performed using the NURBS modeling tool; and processing, by the computer aided design program, the stored NURBS surfaces, at least one of which has been updated by the input to modify the control mesh of the subdivision surface model, for output by a physical device.

2. The method of claim 1, wherein the one or more geometric modifications result from NURBS control vertices changes received as the direct edit previously performed using the NURBS modeling tool, the method comprising:
receiving additional NURBS control vertices changes using the NURBS modeling tool to modify the at least one modified NURBS surface in the stored NURBS surfaces;
modifying the at least one modified NURBS surface in the stored NURBS surfaces in accordance with the additional NURBS control vertices changes input; and
associating with the at least one modified NURBS surface the one or more additional geometric modifications resulting from the additional NURBS control vertices changes.

3. The method of claim 1, wherein obtaining the updated limit surface from the modified control mesh comprises:
calling an adaptive subdivision surface program using the modified control mesh to produce output patches; and
processing the output patches produced by the adaptive subdivision surface program to produce the stored NURBS surfaces.

4. The method of claim 3, wherein the adaptive subdivision surface program is an open source adaptive subdivision surface program, and the output patches produced by the open source adaptive subdivision surface program comprise bi-cubic Bézier patches.

5. The method of claim 1, wherein the computer aided design program comprises a direct modelling surfacer system having associated NURBS modelling tools, a data model for the direct modelling surfacer system with NURBS surfaces as a native data type, and a history system that uses associated history procedures to apply geometric modifications to the stored NURBS surfaces using the direct modelling surfacer system; and wherein the data model is extended to include a subdivision surface data type comprising a group node containing the stored NURBS surfaces representing the limit surface.

6. The method of claim 5, wherein the group node having the subdivision surface data type comprises an associated attribute containing the control mesh of the subdivision surface and the topological control structure.

7. The method of claim 5, comprising:
finding at least one deleted NURBS surface in the stored NURBS surfaces in accordance with one or more of the relationships tracked by the topological control structure and the updated limit surface;
for each of the at least one deleted NURBS surface, removing the deleted NURBS surface from the group node containing the stored NURBS surfaces and updating the relationships in the topological control structure;
finding at least one created NURBS surface in the updated limit surface that, in accordance with one or more of the relationships tracked by the topological control structure, does not have a corresponding NURBS surface in the stored NURBS surfaces; and
for each of the at least one created NURBS surface, adding the created NURBS surface to the group node containing the stored NURBS surfaces and updating the relationships in the topological control structure.

8. The method of claim 1, wherein the computer aided design program comprises two or more programs that operate cooperatively on two or more separate computer processors.

9. The method of claim 1, wherein the physical device comprises a display device, and processing the stored NURBS surfaces for output comprises rendering at least a portion of the stored NURBS surfaces to the display device.

10. The method of claim 1, wherein the physical device comprises a permanent storage device, and processing the stored NURBS surfaces for output comprises rendering at least a portion of the stored NURBS surfaces to an output document stored in the permanent storage device.

11. The method of claim 1, wherein the physical device comprises a digital projector, and processing the stored NURBS surfaces for output comprises rendering at least a portion of the stored NURBS surfaces to an animation document for the digital projector.

12. The method of claim 1, wherein the physical device comprises one or more computer-controlled manufacturing systems comprise an additive manufacturing machine or a subtractive manufacturing machine, and processing the stored NURBS surfaces for output comprises:
generating toolpath specifications for the additive manufacturing machine or the subtractive manufacturing machine using at least a portion of the stored NURBS surfaces; and
manufacturing at least a portion of a physical structure corresponding to the subdivision surface model with the additive manufacturing machine or the subtractive manufacturing machine using the toolpath specifications generated for the additive manufacturing machine or the subtractive manufacturing machine.

13. A system comprising:
a non-transitory storage medium having instructions of a computer aided design program stored thereon; and
one or more data processing apparatus able to run the instructions of the computer aided design program to perform operations specified by the instructions of the computer aided design program to cause the one or more data processing apparatus to:
generate a subdivision surface model of a subdivision surface, the subdivision surface model comprising
a topological control structure that tracks relationships between respective portions of a control mesh of the subdivision surface and stored NURBS surfaces representing a limit surface of the subdivision surface, and
a subdivision surface data structure comprising the stored NURBS surfaces representing the limit surface;
receive a direct edit of at least one of the stored NURBS surfaces performed using a NURBS modeling tool, which forms at least one modified NURBS surface in the stored NURBS surfaces by application of one or more geometric modifications;
associate the one or more geometric modifications, which correspond to the direct edit of the at least one of the stored NURBS surfaces, with the at least one modified NURBS surface;
receive input to modify the control mesh of the subdivision surface model of the subdivision surface;
modify the control mesh in accordance with the input to form a modified control mesh;

obtain an updated limit surface from the modified control mesh;

find the at least one modified NURBS surface in the stored NURBS surfaces in accordance with one or more of the relationships tracked by the topological control structure, the at least one modified NURBS surface having a replacement NURBS surface in the updated limit surface;

update the at least one modified NURBS surface in the stored NURBS surfaces with the replacement NURBS surface;

apply the one or more geometric modifications to the at least one modified NURBS surface in the stored NURBS surfaces to reapply the direct edit previously performed using the NURBS modeling tool; and process the stored NURBS surfaces, at least one of which has been updated by the input to modify the control mesh of the subdivision surface model, for output by a physical device.

14. The system of claim 13, wherein the operations specified by the instructions of the computer aided design program cause the one or more data processing apparatus to obtain the updated limit surface by causing the one or more data processing apparatus to:

call an adaptive subdivision surface program using the modified control mesh to produce output patches; and process the output patches produced by the adaptive subdivision surface program to produce the stored NURBS surfaces.

15. The system of claim 13, wherein the computer aided design program comprises a direct modelling surfacer system having associated NURBS modelling tools, a data model for the direct modelling surfacer system with NURBS surfaces as a native data type, and a history system that uses associated history procedures to apply geometric modifications to the stored NURBS surfaces using the direct modelling surfacer system; and wherein the data model is extended to include a subdivision surface data type comprising a group node containing the stored NURBS surfaces representing the limit surface.

16. The system of claim 13, comprising one or more computer-controlled manufacturing systems comprising an additive manufacturing machine or a subtractive manufacturing machine, wherein the one or more data processing apparatus are able to run the instructions of the computer aided design program to generate toolpath specifications for the additive manufacturing machine or the subtractive manufacturing machine from at least a portion of the stored NURBS surfaces, and to manufacture at least a portion of a physical structure corresponding to the subdivision surface model with the additive manufacturing machine or the subtractive manufacturing machine using the toolpath specifications generated for the additive manufacturing machine or the subtractive manufacturing machine.

17. The system of claim 16, wherein the one or more geometric modifications result from NURBS control vertices changes received as the direct edit previously performed using the NURBS modeling tool, and the operations specified by the instructions of the computer aided design program cause the one or more data processing apparatus to:

find at least one deleted NURBS surface in the stored NURBS surfaces in accordance with one or more of the relationships tracked by the topological control structure and the updated limit surface;

for each of the at least one deleted NURBS surface, remove the deleted NURBS surface from the group node containing the stored NURBS surfaces and update the relationships in the topological control structure;

find at least one created NURBS surface in the updated limit surface that, in accordance with one or more of the relationships tracked by the topological control structure, does not have a corresponding NURBS surface in the stored NURBS surfaces; and for each of the at least one created NURBS surface, add the created NURBS surface to the group node containing the stored NURBS surfaces and update the relationships in the topological control structure.

18. The system of claim 13, wherein the physical device comprises a display device, and the operations specified by the instructions of the computer aided design program cause the one or more data processing apparatus to process the stored NURBS surfaces for output by causing the one or more data processing apparatus to render at least a portion of the stored NURBS surfaces to the display device.

19. A non-transitory computer-readable medium encoding instructions operable to cause data processing apparatus to perform operations comprising:

generating a subdivision surface model of a subdivision surface, the subdivision surface model comprising a topological control structure that tracks relationships between respective portions of a control mesh of the subdivision surface and stored NURBS surfaces representing a limit surface of the subdivision surface, and a subdivision surface data structure comprising the stored NURBS surfaces representing the limit surface;

receiving a direct edit of at least one of the stored NURBS surfaces performed using a NURBS modeling tool, which forms at least one modified NURBS surface in the stored NURBS surfaces by application of one or more geometric modifications;

associating the one or more geometric modifications, which correspond to the direct edit of the at least one of the stored NURBS surfaces, with the at least one modified NURBS surface;

receiving input to modify the control mesh of the subdivision surface model of the subdivision surface;

modifying the control mesh in accordance with the input to form a modified control mesh;

obtaining an updated limit surface from the modified control mesh;

finding the at least one modified NURBS surface in the stored NURBS surfaces in accordance with one or more of the relationships tracked by the topological control structure, the at least one modified NURBS surface having a replacement NURBS surface in the updated limit surface;

updating the at least one modified NURBS surface in the stored NURBS surfaces with the replacement NURBS surface;

applying the one or more geometric modifications to the at least one modified NURBS surface in the stored NURBS surfaces to reapply the direct edit previously performed using the NURBS modeling tool; and processing the stored NURBS surfaces, at least one of which has been updated by the input to modify the control mesh of the subdivision surface model, for output by a physical device.

20. The non-transitory computer-readable medium of claim 19, wherein obtaining the updated limit surface from the modified control mesh comprises:

calling an adaptive subdivision surface program using the modified control mesh to produce output patches; and processing the output patches produced by the adaptive subdivision surface program to produce the stored NURBS surfaces.

21. The non-transitory computer-readable medium of claim 19, wherein the instructions are for a program comprising a direct modelling surfacer system having associated NURBS modelling tools, a data model for the direct modelling surfacer system with NURBS surfaces as a native data type, and a history system that uses associated history procedures to apply geometric modifications to the stored NURBS surfaces using the direct modelling surfacer system; and wherein the data model is extended to include a subdivision surface data type comprising a group node containing the stored NURBS surfaces representing the limit surface.

22. The non-transitory computer-readable medium of claim 21, wherein the one or more geometric modifications result from NURBS control vertices changes received as the direct edit previously performed using the NURBS modeling tool, and the operations comprise:

finding at least one deleted NURBS surface in the stored NURBS surfaces in accordance with one or more of the relationships tracked by the topological control structure and the updated limit surface;

for each of the at least one deleted NURBS surface, removing the deleted NURBS surface from the group node containing the stored NURBS surfaces and updating the relationships in the topological control structure;

finding at least one created NURBS surface in the updated limit surface that, in accordance with one or more of the relationships tracked by the topological control structure, does not have a corresponding NURBS surface in the stored NURBS surfaces; and for each of the at least one created NURBS surface, adding the created NURBS surface to the group node containing the stored NURBS surfaces and updating the relationships in the topological control structure.

23. The non-transitory computer-readable medium of claim 19, wherein the physical device comprises a display device, and processing the stored NURBS surfaces for output comprises rendering at least a portion of the stored NURBS surfaces to the display device.

\* \* \* \* \*

UNITED STATES PATENT AND TRADEMARK OFFICE
CERTIFICATE OF CORRECTION

| | | |
|---|---|---|
| PATENT NO. | : 11,928,391 B2 | |
| APPLICATION NO. | : 16/837618 | |
| DATED | : March 12, 2024 | |
| INVENTOR(S) | : Dan Mircea Lupas | |

It is certified that error appears in the above-identified patent and that said Letters Patent is hereby corrected as shown below:

In the Claims

Column 19, Line 19, in Claim 2: delete "changes input;" and insert --changes;-- therefor.

Signed and Sealed this
Seventh Day of May, 2024

Katherine Kelly Vidal
Director of the United States Patent and Trademark Office